United States Patent [19]
Frank et al.

[11] 4,360,585
[45] Nov. 23, 1982

[54] METHOD OF ETCHING POLYMETHYL METHACRYLATE

[75] Inventors: Paul A. Frank; Bruce F. Griffing, both of Schenectady, N.Y.

[73] Assignee: General Electric Company, Schenectady, N.Y.

[21] Appl. No.: 294,967

[22] Filed: Aug. 21, 1981

[51] Int. Cl.³ .................. B44C 1/22; C03C 15/00; C03C 25/06
[52] U.S. Cl. .................. 430/312; 156/659.1; 156/668; 252/79.1; 427/43.1; 430/435
[58] Field of Search .............. 430/285, 296, 297, 299, 430/312, 313, 317, 329, 464, 502, 506, 435; 427/43.1; 156/659.1, 661.1, 668, 654, 655

[56] References Cited
U.S. PATENT DOCUMENTS
4,051,271 9/1977 Fujishige ............... 427/43.1 X

*Primary Examiner*—William A. Powell
*Attorney, Agent, or Firm*—Julius J. Zaskalicky; James C. Davis, Jr.; Marvin Snyder

[57] ABSTRACT

A method is described for forming a desired pattern in a layer of polymethyl methacrylate resist formed on a substrate by irradiating the layer with a pattern of radiation substantially identical to the desired pattern and thereafter immersing the layer of polymethyl methacrylate in a solution of acetone to remove the irradiated portion of the layer of polymethyl methacrylate.

5 Claims, 2 Drawing Figures

METHOD OF ETCHING POLYMETHYL METHACRYLATE

The present invention relates to a method of etching selected portions of a layer of polymethyl methacrylate.

In the semiconductor industry radiation responsive resists are commonly used in processes for patterning various films and layers of materials utilized in the fabrication of integrated circuits. In one such process, a thick bottom layer of a resist material, such as polymethyl methacrylate, is applied to the substrate or wafer of the integrated circuit to be processed and a thin top layer of another resist material, such as an azide resist, for example, type AZ1450B available from the Shipley Company of Newton, Mass., which includes a novalak resin and a photoactive compound, is provided over the bottom layer. The lower surface of the thick bottom layer of polymethyl methacrylate conforms to the topology of the wafer and the upper surface thereof is substantially planar. The top layer of the two layer resist is exposed to a pattern of radiation in the upper ultraviolet band to which it is sensitive and to which the bottom layer is not sensitive. The exposed portions of the top layer are removed by a suitable solvent or developer leaving retained portions of the top layer. Next, the bottom layer of polymethyl methacrylate resist is exposed through the openings in the top layer to radiation in the lower or deep ultraviolet band to which it is sensitive and to which the top layer is opaque. Thereafter, the exposed portions of the bottom layer are removed by a suitable solvent or developer such as methyl isobutyl ketone (MIBK) diluted with isopropanol, leaving retained portions of the bottom layer which are then utilized in the processing of the wafer. In order to achieve high resolution, this developer must dissolve polymethyl methacrylate which has been exposed to deep ultraviolet radiation much more rapidly than unexposed polymethyl methacrylate. Furthermore, it is desirable for complete development to take a reasonable time, for example, a fraction of a minute.

For developers used in two level resist technology, it is important that the ratio of development rate for exposed to unexposed materials of the resist, designated $D_r$, be large. Since the development of the layer of polymethyl methacrylate proceeds from the surface thereof to the interface, features near the top of the layer are developed laterally at the unexposed development rate for most of the development time. This effect leads to a wall angle equal to $\tan(1/D_r)$ in a perfectly exposed layer or film. What is needed is a developer having a ratio $D_r$ such that the wall angle is quite small, i.e., a wall nearly vertical, so that high resolution patterns can be produced in thick films or layers of resist. An additional requirement is that the developer be compitable with the thin patterning layer used on the surface of the layer of polymethyl methacrylate. In order to attain compatibility, the developer must either completely remove the patterning layer or leave it unaffected. Softening and subsequent distortions of the patterning layer by the polymethyl methacrylate developer are not acceptable.

Heretofore, methyl-isobutyl-ketone (MIBK) diluted with isopropanol has been used as a developer for polymethyl methacrylate. The development rate $D_r$ for MIBK developers can be greater than 100. However, problems arise in the use of a MIBK developer due to an insoluble layer formed at the interface between the layer of polymethyl methacrylate and the patterning layer which is relatively insoluble in MIBK developers. The presence of an interface layer leads to uneven development and consequent uneven line widths and profiles. It is believed that the interface layer is produced by the interaction of the constituents of the two layers of the resist, one a polymethyl methacrylate based resist and the other a novalak based resist utilizing an acetate solvent, in the process of formation of the two layers from solutions thereof. It is believed that the polymethyl methacrylate and the novalak polymers become intertwined. Thus, the novalak polymers in the interface layer is protected by the polymethyl methacrylate against novalak developer and the polymethyl methacrylate polymer in the interface layer is protected by the novalak polymer against polymethyl methacrylate developer resulting in the uneven development referred to above.

The present invention is directed to the provision of a developer for polymethyl methacrylate which avoids the problems recited above in connetion with conventional developers.

In carrying out the method of the present invention in accordance with an embodiment thereof, a substrate having a surface to be patterned is provided. A first layer of polymethyl methacrylate is formed on the surface of the substrate. A second layer of a resist containing a novalak resin is formed on the first layer of polymethyl methacrylate. A pattern which it is desired to transfer to the first layer is formed in the second layer to expose portions of the first layer of polymethyl methacrylate uncovered thereby. The second layer and the exposed portions of the first layer of polymethyl methacrylate are irradiated with radiation to which the polymethyl methacrylate is sensitive for a time to depolymerize the exposed portions of polymethyl methacrylate. The first and second layers are then immersed in a solution of acetone to remove the exposed portions of the first layer of polymethyl methacrylate and the second layer of resist.

The features which are believed to be characteristic of the present invention are set forth with particularity in the appended claims. The invention itself, both as to it organization and method of operation, together with further objects and advantages thereof may best be understood by reference to the following description taken in connection with the accompanying drawings in which:

Figure 1:
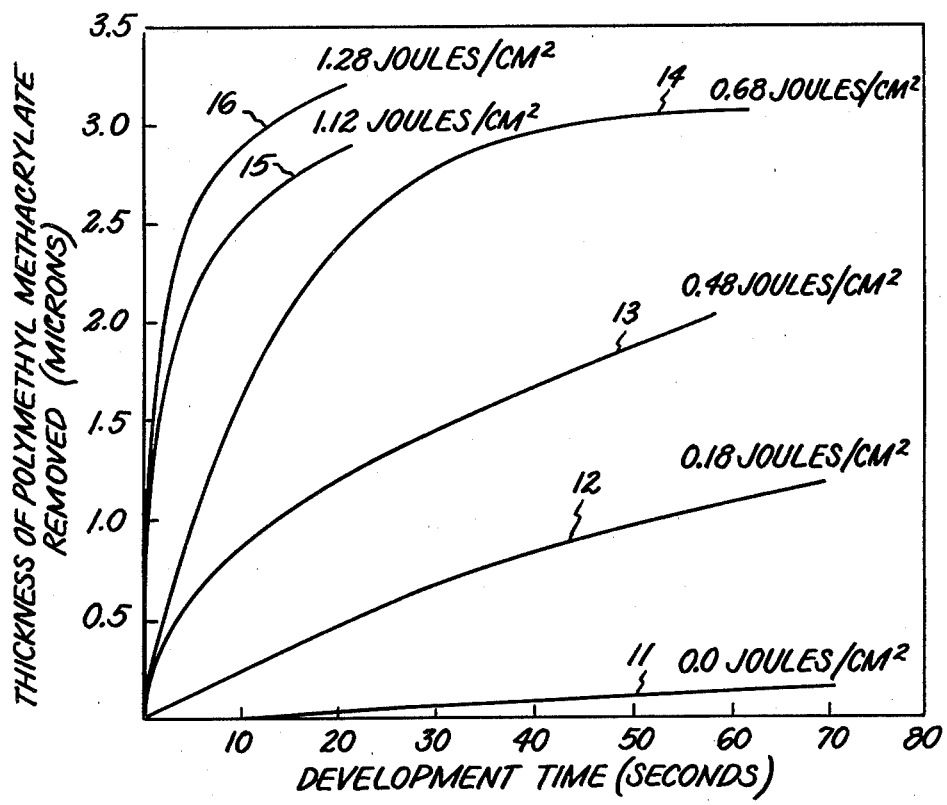
FIG. 1 shows a family of graphs, each for a respective layer of polymethyl methacrylate. Each graph shows thickness of polymethyl methacrylate removed versus time for development using an acetone developer of the present invention after exposure to a respective radiation dosage expressed in joules per $cm^2$ to which it is sensitive.

The method of the present invention will be described in connection with a specific example. A substrate of silicon semiconductor material with a layer of silicon dioxide formed thereon was provided. A solution of polymethyl methacrylate consisting of 8 parts of polymethyl methacrylate (DuPont Elvacite 2041) and 92 parts of toluene by weight was deposited on the surface of the layer of silicon dioxide. The substrate was then spun at a speed of about 5000 rpm for about 20 seconds to form a first resist layer on the surface of the layer of silicon dioxide constituted of polymethyl methacrylate about 0.8 micron thick. Thereafter, the substrate was heated at a temperature of about 170° C. for a period of 20 minutes to remove any residue of toluene in the layer of polymethyl methacrylate and to enhance the adhesion of the layer of polymethyl methacrylate to the surface of the layer of silicon dioxide. The temperature of heating was chosen to be less than the temperature at which significant decomposition of polymer occurs.

Next, an azide photoresist material specifically, type AZ1450B available from the Shipley Company of Newton, Mass. was deposited on the surface of the layer of polymethyl methacrylate. The azide resist comprises essentially a novalak resin which is soluble in an alkaline solvent or developer, a photoactive compound such as dizaonaphthoquinone which inhibits solubility in the novalak resin in the alkaline solvent until it is activated by radiation, a suitable solvent for the resist such as cellosolve acetate and minor ingredients such as film forming additives, dyes and plasticers. The substrate was then spun at a speed of about 6000 rpm for about 15 seconds to form a second layer about 0.3 micron thick on the first resist layer of polymethyl methacrylate. Thereafter, the substrate was heated at a temperature of about 95° C. for a period of 7 minutes to remove any residue of the solvent.

The second resist layer was exposed to a pattern of radiation in the band of wavelengths in the range of about 405 to about 436 nanometers to form a corresponding pattern of exposed or irradiated portions and unexposed portions in the second resist layer. The exposed portions of the second layer of resist were removed by immersing the substrate and the resist layers in a suitable developer, such as Shipley MF-351 developer, to form a pattern of removed portions and retained portions in the layer.

Next the substrate was irradiated with deep ultraviolet radiation in the band from about 200 to about 230 nanometers which was blocked by the unremoved portions of the second resist layer and was passed through the removed portions thereof impinging on the first resist layer of polymethyl methacrylate. As the polymethyl methacrylate is sensitive to this band of radiation, scission or depolymerization of the polymethyl methacrylate material occurred. The first resist layer was provided with radiation of a specific energy density of 0.68 joules/cm. Thereafter, the first and second layers were immersed in a solution consisting of 2 parts acetone and 1 part of isopropanol for 20 seconds which removed the exposed portion of the layer of polymethyl methacrylate and also removed the second thin layer of resist. While the exposed portion of the first layer of polymethyl methacrylate and the second layer of resist were removed by immersion in the solution of acetone, the layers could have been removed by other means such as spraying with the acetone solution.

Referring now to FIG. 1, there is shown a family of empirical graphs 11-16, each graph for a respective layer of polymethyl methacrylate. Each graph shows thickness of polymethyl methacrylate removed versus time for development or removal thereof after exposure to a respective radiation dosage, expressed in joules per cm$^2$, of radiation in the band of 214-230 nanometers using an acetone developer consisting of 2 parts acetone and 1 part isopropanol. Graph 11 shows the thickness or depth of removal for no exposure to radiation. The dosages represented by graphs 11-16 are respectively 0, 0.18, 0.48, 0.68, 1.12 and 1.28 joules per cm$^2$. Thus, the time required for removal of a specific thickness of polymethyl methacrylate using a developer consisting of 2 parts acetone and 1 part isopropanol is dependent on the dosage of radiation applied thereto.

Figure 2:
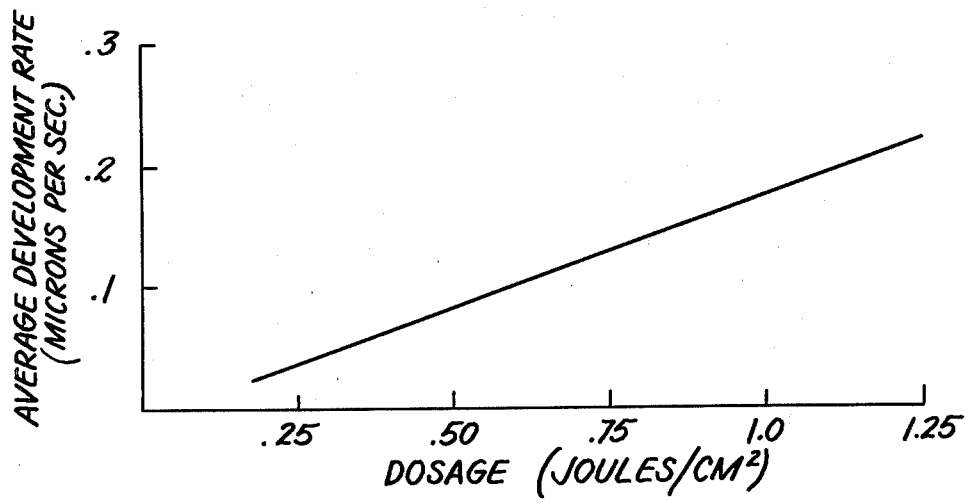
FIG. 2 shows a graph of average development rate in microns per second of a layer of polymethyl methacrylate as a function of dosage of radiation in joules per $cm^2$ to which it is exposed using a developer consisting of a solution of 2 parts acetone and 1 part isopropanol. The development rate represents the average over a 20 second development time.

Reference is now also made to FIG. 2 which shows a graph of the average development rate of a layer of polymethyl methacrylate utilizing an acetone developer consisting of 2 parts of acetone and 1 part of isopropanol as a function of dosages of ultraviolet radiation in the band of 214–230 nanometers. The development rate represents the average over a 20 second development time. The relationship between the development rate and the dosage is linear. Thus, to provide a steep wall in the first resist layer of polymethyl methacrylate, a high dosage would be utilized. Preferably, the thickness of the layer desired to be removed for a given exposure should be overdeveloped to assure good development of all features of the exposed resist.

While the graphs of FIG. 1 show the relationship between polymethyl methacrylate removed as a function of development time for a diluent for acetone, in particular isopropanol, and in a specific proportion thereof to acetone, other proportions of the solvent may be utilized. With higher proportion of solvent, longer development time would be required to remove a given thickness of polymethyl methacrylate and conversely for more concentrate solutions of acetone the given thickness of polymethyl methacrylate would be removed in a shorter time.

While the diluent used for acetone was isopropanol, other solvents may be utilized such as ethanol.

In addition to providing a solvent which removes the interface layer between azide resist and the polymethyl methacrylate resist mentioned above, the acetone solvent removes the developed resist at a much more rapid rate than the conventional developer methyl-isobutylketone thereby reducing the time required for processing integrated circuits.

While the developer of the present invention is particularly applicable to two level resists consisting of a first layer of polymethyl methacrylate and a second layer of a resist containing a novalak resin, the developer is applicable as well to single layer resists constituted of polymethyl methacrylate. In this case the developer provides more rapid development of patterns formed therein by exposure to radiation than conventional developers.

While the invention has been described in a specific embodiment, it will be understood that modifications, such as those described above may be made by those skilled in the art and it is intended by the appended claims to cover all such modifications and changes as fall within the true spirit and scope of the invention.

What is claimed is:

1. A method of forming a first pattern in a first layer of polymethyl methacrylate formed on the surface of a substrate comprising:
   providing said substrate having said surface,
   forming said first layer of polymethyl methacrylate on said surface,
   forming a second layer of a resist containing a novalak resin on said first layer of polymethyl methacrylate, forming in said second layer a second pattern which is substantially identical to said first pattern to expose portions of said first layers of polymethyl methacrylate uncovered thereby, irradiating said second layer and said exposed portions of said first layer of polymethyl methacrylate with radiation to which polymethyl methacrylate is sensitive for a time to substantially depolymerize said exposed portions of polymethyl methacrylate, treating said first and second layers in a solution including acetone to remove said exposed portions of said first layer of polymethyl methacrylate and said second layer of resist.

2. The method of claim 1 in which said first layer is substantially thicker than said second layer.

3. The method of claim 1 in which the said solution includes acetone and isopropanol.

4. The method of claim 3 in which said solution consists of 2 parts of acetone and 1 part of isopropanol by volume.

5. The method of claim 1 in which said first and second layers are immersed in a solution of acetone to remove said exposed portions of said first layer of polymethyl methacrylate and said second layer of resist.

* * * * *